US008179136B2

(12) United States Patent  
Chan et al.

(10) Patent No.: US 8,179,136 B2
(45) Date of Patent: May 15, 2012

(54) RADIO FREQUENCY (RF) COIL ARRAY WITH DOUBLE ASYMMETRIC SADDLE COIL PAIRS

(75) Inventors: Pei H. Chan, Aurora, OH (US); Dan K. Spence, Hartland, WI (US); Fraser J. Robb, Aurora, OH (US); Vincent W. Chen, Aurora, OH (US); Modhurin Banerjee, Streetsboro, OH (US); Victor Taracila, Beachwood, OH (US)

(73) Assignee: General Electric Company, Schenectady, NY (US)

( * ) Notice: Subject to any disclaimer, the term of this patent is extended or adjusted under 35 U.S.C. 154(b) by 352 days.

(21) Appl. No.: 12/474,624

(22) Filed: May 29, 2009

(65) Prior Publication Data

US 2010/0265020 A1 Oct. 21, 2010

Related U.S. Application Data

(60) Provisional application No. 61/170,538, filed on Apr. 17, 2009.

(51) Int. Cl.
*G01V 3/00* (2006.01)

(52) U.S. Cl. ........................................ 324/318; 324/322

(58) Field of Classification Search .......... 324/300–322; 600/407–445
See application file for complete search history.

(56) References Cited

U.S. PATENT DOCUMENTS

| | | | |
|---|---|---|---|
| 4,825,162 A | 4/1989 | Roemer et al. | |
| 5,370,118 A * | 12/1994 | Vij et al. | 600/422 |
| 5,500,596 A | 3/1996 | Grist et al. | |
| 5,548,218 A * | 8/1996 | Lu | 324/318 |
| 5,664,568 A | 9/1997 | Srinivasan et al. | |
| 6,289,232 B1 | 9/2001 | Jakob et al. | |
| 6,317,619 B1 * | 11/2001 | Boernert et al. | 600/410 |
| 6,335,620 B1 * | 1/2002 | Weissenberger | 324/307 |
| 6,377,836 B1 * | 4/2002 | Arakawa et al. | 600/422 |
| 6,414,485 B1 | 7/2002 | Kato et al. | |
| 6,441,612 B1 | 8/2002 | Shimo et al. | |
| 6,529,004 B1 | 3/2003 | Young | |
| 6,577,888 B1 * | 6/2003 | Chan et al. | 600/422 |
| 6,624,633 B1 * | 9/2003 | Zou et al. | 324/318 |
| 6,661,227 B2 | 12/2003 | Eggers et al. | |
| 6,701,177 B2 | 3/2004 | Su | |
| 6,784,665 B1 | 8/2004 | Chan et al. | |
| 6,788,057 B1 * | 9/2004 | Petropoulos et al. | 324/318 |
| 6,828,791 B2 * | 12/2004 | Morita et al. | 324/318 |
| 6,879,159 B2 | 4/2005 | Yoshida | |
| 6,914,432 B2 * | 7/2005 | Dumoulin et al. | 324/318 |
| 6,930,481 B2 | 8/2005 | Okamoto et al. | |
| 6,980,002 B1 | 12/2005 | Petropoulos et al. | |
| 2002/0180442 A1 * | 12/2002 | Vij | 324/322 |
| 2003/0132750 A1 | 7/2003 | Machida et al. | |
| 2003/0184294 A1 | 10/2003 | Boskamp et al. | |
| 2004/0196042 A1 | 10/2004 | Fujita et al. | |
| 2005/0107686 A1 | 5/2005 | Chan et al. | |
| 2005/0122110 A1 | 6/2005 | Feng et al. | |
| 2005/0122111 A1 | 6/2005 | Feng et al. | |
| 2008/0231279 A1 | 9/2008 | Iwadate | |

OTHER PUBLICATIONS

Pruessmann et al., SENSE: Sensitivity Encoding for Fast MRI, Magnetic Resonance in Medicine 42:952-962 (1999).

(Continued)

*Primary Examiner* — Brij Shrivastav  
(74) *Attorney, Agent, or Firm* — The Small Patent Law Group; Dean D. Small (57) ABSTRACT

A radio frequency (RF) coil array includes a plurality of RF coil sections arranged in a superior-inferior direction. Each RF coil section includes a plurality of asymmetric saddle coil pairs configured in an overlapping arrangement in a left-right direction. The plurality of asymmetric saddle coil pairs may include three asymmetric saddle coil pairs arranged in a left-right direction. The position of the asymmetric saddle coil pairs on the left and right may be shifted in the superior-inferior direction with respect to the middle asymmetric saddle coil pair. In an alternative configuration, each RF coil section includes a first loop coil, an asymmetric saddle coil pair and a second loop coil arranged in a left-right direction.

25 Claims, 5 Drawing Sheets

OTHER PUBLICATIONS

Hajnal et al., An Array that Exploits Phase for SENSE Imagining, Proc. Intl. Soc. Mag. Reson. Med. 8 (2000), p. 1719.

Fujita et al., A Novel 8-Channel "Saddle-Train" Array Coil for Abdominal SENSE Imaging at 1.5T, Proc. Intl. Soc. Mag. Reson. Med. 10 (2002).

Ohliger et al., Concentric Coil Arrays for Spatial Encoding in Parallel MRI, Proc. Intl. Soc. Mag. Reson. Med 9 (2001), p. 21.

Feng et al, The SENSE CTL Coil for 3T 8-Channel MRI Systems, Proc. Intl. Mag. Reson. Med. 11: 2634 (2004).

Chan, Self-Decoupled Asymmetric Saddle Coil Array for SENSE Imaging, Proc. Intl. Soc. Mag. Reson. Med. 14: 3529 (2006).

Kumar et al, Optimized Quadrature Surface Coils incorporating Circular, Figure-8 loops, and Strips, Proc. Intl. Soc. Mag. Reson. Med. 15: 1049 (2007).

* cited by examiner

RADIO FREQUENCY (RF) COIL ARRAY WITH DOUBLE ASYMMETRIC SADDLE COIL PAIRS

CROSS REFERENCE TO RELATED APPLICATION

The present application claims the benefit of U.S. Provisional Application Ser. No. 61/170,538, filed Apr. 17, 2009, herein incorporated by reference in its entirety.

FIELD OF THE INVENTION

The present invention relates generally to a magnetic resonance imaging (MRI) system and in particular to a radio frequency (RF) coil array using double asymmetric saddle coil pairs.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

As mentioned, RF coils are used in an MRI system to transmit RF excitation signals and to receive MR signals emitted by an imaging subject. Various types of RF coils may be utilized in an MRI system such as a whole-body coil and RF surface (or local) coils. Typically, the whole-body RF coil is used for transmitting RF excitation signals, although a whole-body RF coil may also be configured to receive MRI signals. One or more (e.g., an array) surface coils can be used as receive coils to detect MRI signals or, in certain applications, to transmit RF excitation signals. Surface coils may be placed in close proximity to a region of interest in a subject and, for reception, typically yield a higher signal-to-noise ratio (SNR) than a whole-body RF coil.

An array of surface RF coils can be used for "parallel imaging," a technique developed to accelerate MR data acquisition. In parallel imaging, multiple receive RF coils acquire (or receive) data from a region or volume of interest. For example, to perform parallel imaging for the human spine and torso, a three-dimensional (3D) RF coil array is used. A 3D RF coil array typically consists of an anterior two-dimensional (2D) RF coil array and a posterior 2D RF coil array. Many existing 2D RF coils arrays for MRI are constructed using linear loop coils and a single layer structure. In order to improve SNR of an RF coil array, multiple layer coil configurations have been developed (for example, two-layer loop-saddle quadrature pairs) and used in, for example, one-dimensional (1D) RF coil arrays.

Human spine and torso imaging require different designs of RF coil geometry to achieve the best performance for each of the different anatomies. RF coils dedicated for spine imaging usually have multiple layers of smaller coil elements, for example, loop-saddle quadrature pairs, optimized for providing the best SNR for the spine at a shallow depth close to the coil elements. RF coils for torso imaging, on the other hand, use large size coil elements to accomplish better signal penetration for the deep tissue of the human body.

It would be desirable to provide a multi-dimensional RF coil array that uses multi-layer coil elements. It would also be desirable to provide a multi-dimensional RF coil array that combines the best imaging capabilities of spine RF coils and torso RF coils into one single RF coil array system.

BRIEF DESCRIPTION OF THE INVENTION

In accordance with an embodiment, a radio frequency (RF) coil array includes a first asymmetric saddle coil pair, a second asymmetric saddle coil pair, and a third asymmetric saddle coil pair, wherein the first, second and third asymmetric saddle coil pairs are arranged in a left-right direction.

In accordance with another embodiment, a radio frequency (RF) coil array includes a plurality of RF coil sections arranged in a superior-inferior direction, each RF coil section including a plurality of asymmetric saddle coil pairs configured in an overlapping arrangement in a left-right direction.

In accordance with another embodiment, a radio frequency (RF) coil array includes a plurality of RF coil sections arranged in a superior-inferior direction, each RF coil section comprising a first loop coil, an asymmetric saddle coil pair and a second loop coil configured in an overlapping arrangement in a left-right direction.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
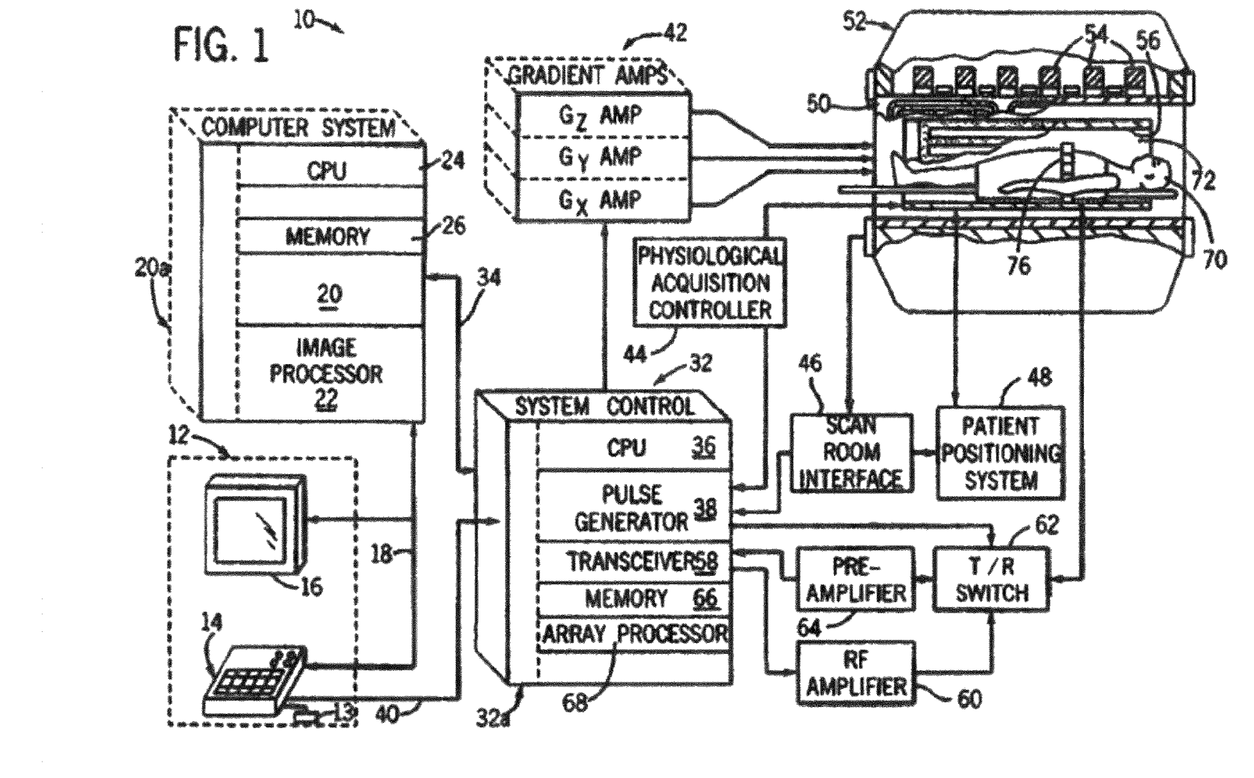
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
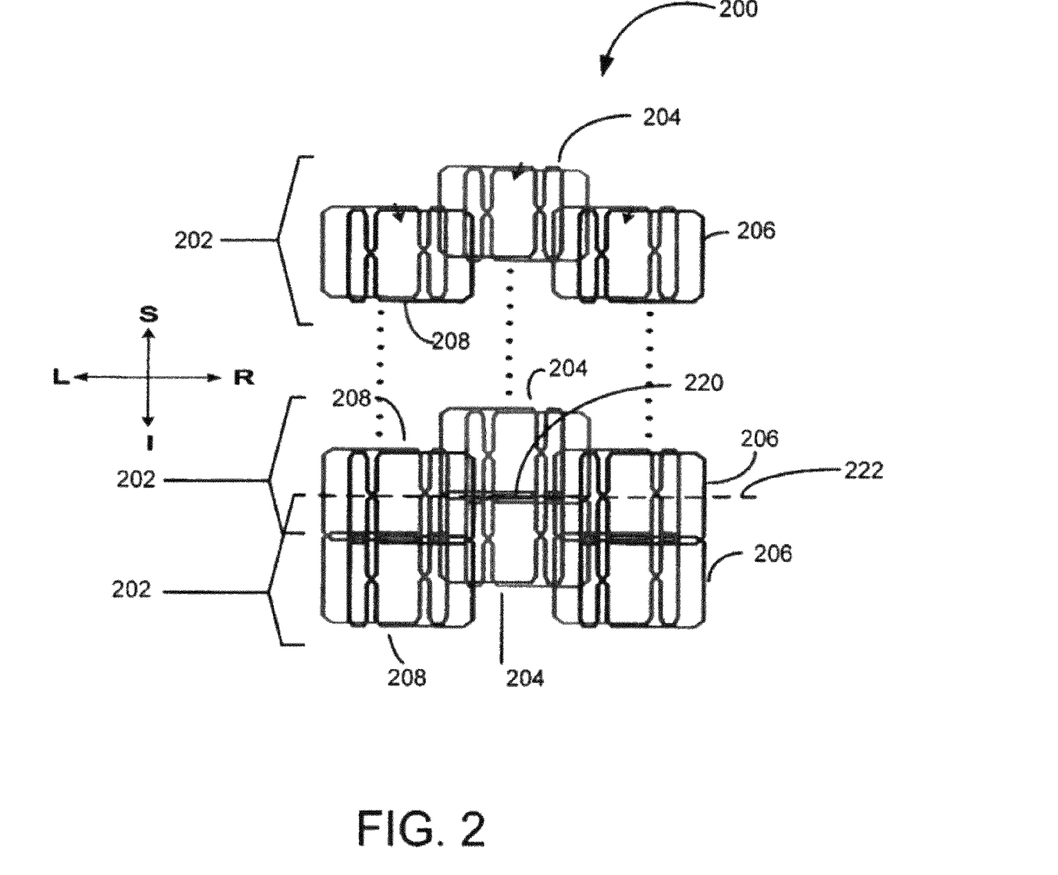
FIG. 2 shows an RF coil array in accordance with an embodiment.

As mentioned, RF coils (for example, RF body coil 56 and a surface coil or coils 76) may be used to transmit RF excitation pulses and/or to receive MR signals. An array of RF surface coils 76 may be used, for example, for parallel imaging applications to receive data from a region or volume of interest. FIG. 2 shows an RF coil array in accordance with an embodiment. The 2D RF coil array 200 consists of multiple tiles or coil sections 202 arranged in the superior-inferior (S-I) direction. Each tile 202 consists of three double asymmetric saddle (DAS) coil pairs arranged in the left-right direction, in particular, a middle DAS coil pair 204, a right side DAS coil pair 206 and a left side DAS coil pair 208. RF coil array 200 can be used for an anterior coil array and/or for a posterior coil array.

Figure 3:
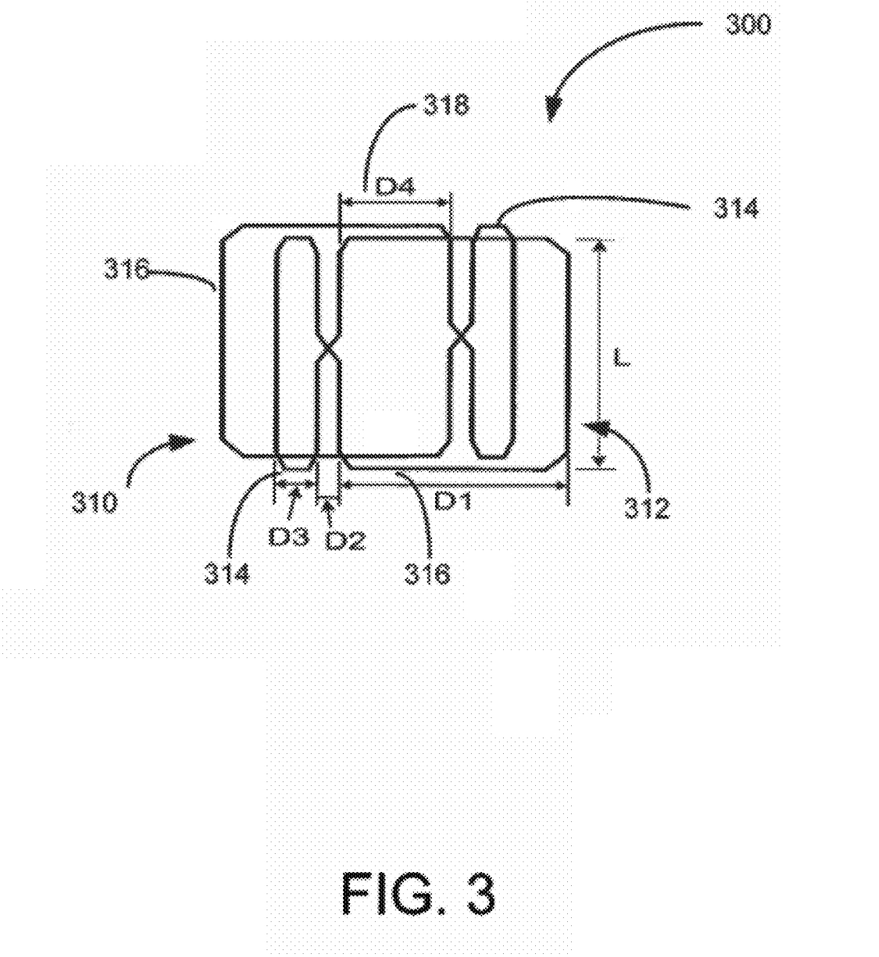
FIG. 3 shows a double asymmetric saddle coil pair in accordance with an embodiment.

Each DAS coil pair 204, 206, 208 consists of two highly overlapped asymmetric saddle coils. FIG. 3 shows a double asymmetric saddle coil pair in accordance with an embodiment. In FIG. 3, a double asymmetric saddle (DAS) coil pair 300 includes a first asymmetric saddle coil 310 and a second asymmetric saddle coil 312. Each asymmetric saddle coil 310, 312 has a small wing 314 and a large wing 316. The width (D1) of the large wing 316 is larger than the width (D3) of the small wing 314 (e.g., D1/D3>1). Each wing 314, 316 in FIG. 3 is shown having an exemplary length, L. The shape of the two wings 314, 316 for each asymmetric saddle coil 310, 312 can be arbitrary. As the ratio of the size of the large wing 316 over that of the small wing 314 becomes much larger than unity, the MRI efficiency of the asymmetric saddle coil will approach to that of a loop coil of similar size and therefore the performance will be better than that of a conventional saddle coil. Accordingly, each of the asymmetric saddle coils 310, 312 behaves very much like a loop coil and has similar efficiency for MRI as a loop coil. The direction of the magnetic flux produced in one wing of an asymmetric saddle coil is opposite to that produced in the other wing, for example, if the magnetic flux in the first wing of an asymmetric saddle coil is pointing out of the surface of the first wing, then the magnetic flux in the second wing will be pointing into the surface of the second wing The first asymmetric saddle coil 310 and the second asymmetric saddle coil 312 are overlapped to form the DAS coil pair 300. The overlap, for example, the overlap region D4 (318) of the large wing of the first asymmetric saddle coil 310 and the large wing of the second asymmetric 312, increases the signal sensitivity of the coil array 200 (shown in FIG. 2), for example, at the middle of the coil array for the spine region. In addition, the quadrature nature between the two asymmetric saddle coils 310, 312 keeps the correlated noise low. This results in significant SNR improvement for, for example, spine imaging. The asymmetric design of the two wings 314, 316 of each asymmetric saddle coil 310, 312 allows an increase in the overlap area (or region) 318 between them, for example, the exemplary overlap area 318 of the large wings 316 shown in FIG. 3 is about 45% of the large wing 316 area of each of the asymmetric saddle coils 310, 312. The increase in overlap area 318 improves the SNR at the overlap region 318. The large overlap area 318 is due to the quadrature nature between the two asymmetric saddle coils 310, 312 and, as mentioned, increases the signal while keeping the correlated noise low to achieve significant SNR improvement. A double asymmetric coil pair 300 may be used in a large RF coil array to further increase the SNR of the RF coil array.

Returning to FIG. 2, in each tile or coil section 202 the right side DAS coil pair 206 and the left side DAS coil pair 208 may be shifted in the superior-inferior (S-I) direction with respect to the middle DAS coil pair 204. The center of each of the right and left DAS coil pair 206, 208 is lined up with an overlap region 220 between the middle DAS coil pair 204 in adjacent tiles 202 in the S-I direction, as indicated by the horizontal dashed line 222 in FIG. 2. In this configuration, the right and left side DAS coil pairs 206, 208 compensate for the signal drop off at the overlap region 220 between two adjacent middle DAS coil pairs 204 so that the image uniformity in the S-I direction is improved. The configuration shown in FIG. 2 also allows the right and left side DAS coil pairs 206, 208 to overlap more into the middle DAS coil pair 204 and to be closer to the middle of the coil array 200 to, for example, further improve the SNR for spine imaging. In addition, the mutual inductance between each DAS coil pair and its nearest neighbor coil elements can be minimized simultaneously. An exemplary number of DAS coil tiles 202 are shown in FIG. 2. Fewer or more tiles 202 can be used. For example, DAS coil tiles 202 can be repeated in the S-I direction to form a larger RF coil array system for covering a larger field-of-view (FOV). The RF coil array 200 can be used for both spine and torso imaging and provides improved image quality and uniformity and improved efficiency of the imaging. The RF coil array 200 can be used for 3D parallel imaging for both spine imaging and torso imaging.

Figure 4:
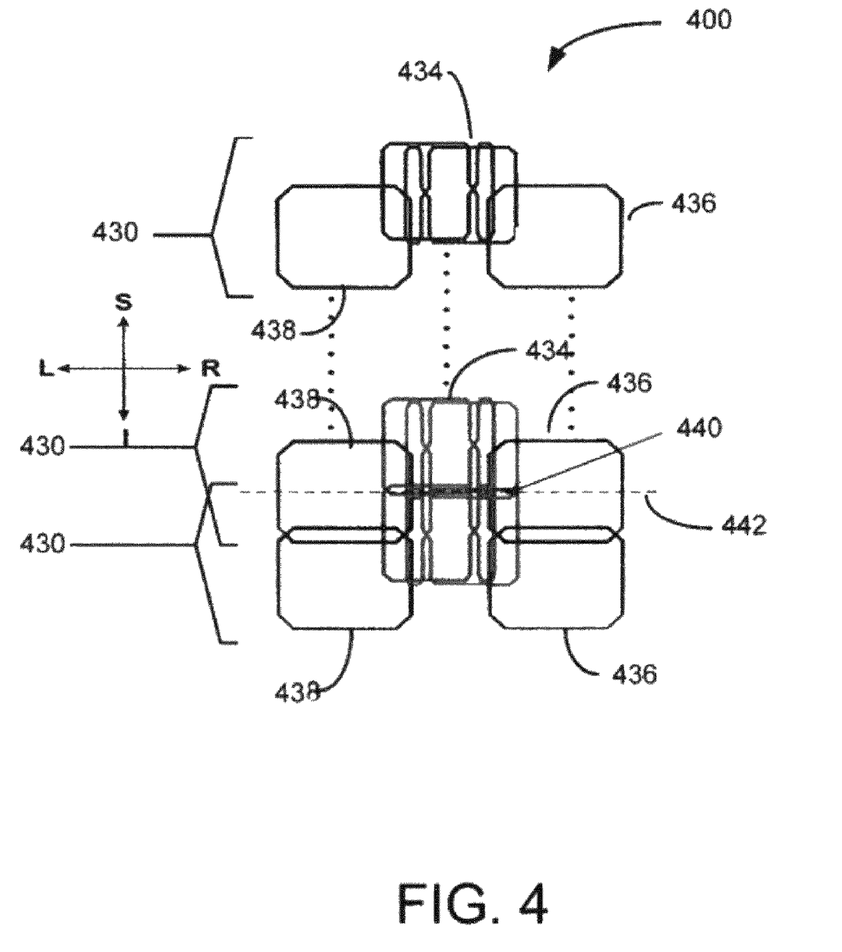
FIG. 4 shows an RF coil array in accordance with an embodiment.

In another embodiment, the right and left side DAS coil pairs 206, 208 shown in FIG. 2 can each be replaced with a loop coil. FIG. 4 shows an RF coil array in accordance with an embodiment. The 2D RF coil array 400 consists of multiple double loop-asymmetric saddle tiles or coil sections 430 arranged in the superior-inferior (S-I) direction. Each tile 430 consists of a double asymmetric saddle (DAS) coil pair 434, a first loop coil 436 and a second loop coil 438. In each tile 430, the first loop coil 436 and the second loop coil 438 may be shifted in the superior-inferior (S-I) direction with respect to the middle DAS coil pair 434. The center of each of the first and second loop coils 436, 438 is lined up with an overlap region 440 between the middle DAS coil pair 434 in adjacent tiles 430 in the S-I direction, as indicated by the horizontal dashed line 442 in FIG. 4. In this configuration, the first and second loop coils 436, 438 compensate for the signal drop off at the overlap region 440 between two adjacent middle DAS coil pairs 434 so that the image uniformity in the S-I direction is improved. The configuration shown in FIG. 4 also allows the first and second loop coils 436, 438 to overlap more into the middle DAS coil pair 434 and to be closer to the middle of the coil array 400 to, for example, further improve the SNR for spine imaging. In addition, the mutual inductance between loop coil and its nearest neighbor coil elements can be minimized simultaneously. An exemplary number of tiles 430 are shown in FIG. 4. Fewer or more tiles 430 may be used. For example, the double loop-asymmetric saddle coil tiles 430 can be repeated in the S-I direction to form a larger RF coil array system for covering a larger field-of-view (FOV). The RF coil array 400 can be used for both spine and torso imaging and provides better imaging quality and efficiency of the imaging. The RF coil array 400 can be used for 3D parallel imaging for both spine imaging and torso imaging.

Figure 5:
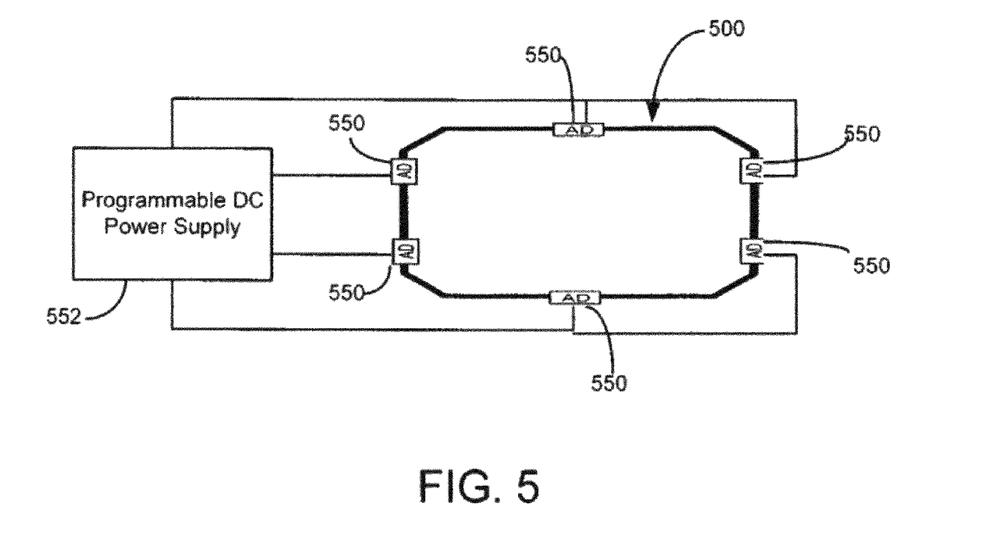
FIG. 5 shows a loop coil element with active decoupling in accordance with an embodiment.
Figure 6:
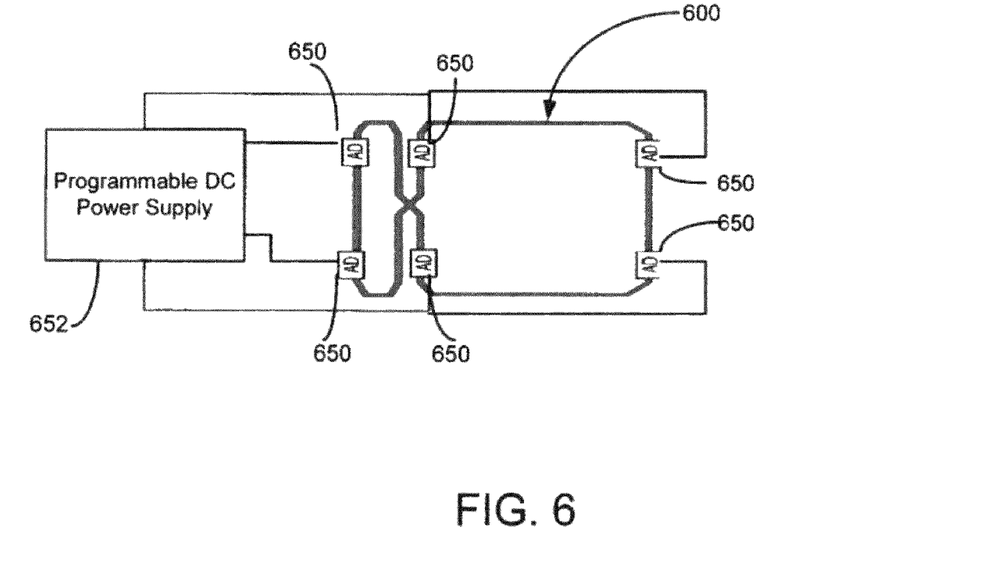
FIG. 6 shows an asymmetric saddle coil element with active decoupling in accordance with an embodiment.

In other embodiments, each asymmetric saddle coil element of the RF coil array in FIGS. 2 and 4 and each loop coil element of the RF coil array of FIG. 4 is equipped with multiple active decoupling (AD) networks or switches as shown in FIGS. 5 and 6. FIG. 5 shows a loop coil element with active decoupling in accordance with an embodiment and FIG. 6 shows an asymmetric saddle coil element with active decoupling in accordance with an embodiment. Referring to FIGS. 5 and 6, the active decoupling networks or switches 550, 650 can be controlled, i.e., turned on/off, using a DC voltage/current. Accordingly, a programmable DC power supply 552, 652, e.g., a programmable multiple coil (MC) bias DC power supply of a MRI scanner system, is connected to the active decoupling networks 550, 650. When the active decoupling networks or switches 550, 650 of a coil element 500, 600 are turned on, the coil element will be effectively desensitized and become electrically and magnetically transparent to a coil system that is used nearby. If all the active decoupling networks or switches of an RF coil array system are turned on, the entire RF coil array system will become electrically and magnetically transparent to other coil systems that are used in its vicinity. The other coil system can either be resonated at the same frequency of the RF coil array system or at a different resonating frequency, for example, at the Larmor frequency of Carbon-13.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A radio frequency (RF) coil array comprising:
a first asymmetric saddle coil pair;
a second asymmetric saddle coil pair; and
a third asymmetric saddle coil pair, wherein the first, second and third asymmetric saddle coil pairs include a first asymmetric saddle coil and a second asymmetric saddle coil, wherein the first, second and third asymmetric saddle coil pairs are arranged in a first direction and one of the first, second and third asymmetric saddle coil pairs is shifted in a second different direction.

2. An RF coil array according to claim 1, wherein the first asymmetric saddle coil and the second asymmetric saddle coil are overlapping.

3. An RF coil array according to claim 1, wherein a first portion of the first asymmetric saddle coil pair overlaps a first portion of the second asymmetric saddle coil pair.

4. An RF coil array according to claim 1, wherein a first portion of the third asymmetric saddle coil pair overlaps a second portion of the second asymmetric saddle coil pair.

5. An RF coil array according to claim 1, wherein the second direction is a superior-inferior direction and the first direction is a left-right direction with respect to the superior-inferior direction, and a position of a center of the first asymmetric saddle coil pair is shifted in the superior-inferior direction with respect to a position of the second asymmetric saddle coil pair.

6. An RF coil array according to claim 5, wherein a position of a center of the third asymmetric saddle coil pair is shifted in the superior-inferior direction with respect to a position of the second asymmetric saddle coil pair.

7. An RF coil array according to claim 1, wherein each of the first and second asymmetric saddle coils comprises a first wing and a second wing, wherein the first wing is larger than the second wing.

8. An RF coil according to claim 1, wherein the first, second and third asymmetric saddle coil pairs are configured to form a coil section.

9. An RF coil array according to claim 8, further comprising a plurality of additional asymmetric saddle coil pairs configured to form a plurality of additional coil sections.

10. An RF coil array according to claim 9, wherein the second direction is a superior-inferior direction and the plurality of coil sections are aligned in the superior-inferior direction.

11. An RF coil array according to claim 9, wherein the plurality of coil sections are configured to provide spine imaging.

12. An RF coil array according to claim 9, wherein the plurality of coil sections are configured to provide torso imaging.

13. A radio frequency (RF) coil array comprising:
a plurality of RF coil sections arranged in a superior-inferior direction, each RF coil section comprising a plurality of asymmetric saddle coil pairs including a first asymmetric saddle coil and a second asymmetric saddle coil, the plurality of asymmetric saddle coil pairs configured in an overlapping arrangement in a left-right direction and one of the plurality of asymmetric saddle coil pairs shifted in the superior-inferior direction.

14. An RF coil array according to claim 13, wherein the plurality of RF coil sections are configured in an overlapping arrangement.

15. An RF coil array according to claim 13, wherein the first asymmetric saddle coil and the second asymmetric saddle coil are overlapping.

16. An RF coil array according to claim 14, wherein the plurality of asymmetric saddle coil pairs comprises:
a first asymmetric saddle coil pair;
a second asymmetric saddle coil pair; and
a third asymmetric saddle coil pair, wherein the first, second and third asymmetric saddle coil pairs are arranged in the left-right direction.

17. An RF coil array according to claim 16, wherein a position of a center of the first asymmetric saddle coil pair is shifted in the superior-inferior direction to align with an overlap region between adjacent RF coil sections.

18. An RF coil array according to claim 17, wherein a position of a center of the third asymmetric saddle coil pair is shifted in the superior-inferior direction to align with an overlap region between adjacent RF coil sections.

19. An RF coil array according to claim 13, wherein the plurality of RF coil sections are configured as a posterior imaging array.

20. An RF coil array according to claim 13, wherein the plurality of RF coil sections are configured as an anterior imaging array.

21. A radio frequency (RF) coil array comprising:
a plurality of RF coil sections arranged in a superior-inferior direction, each RF coil section comprising a first loop coil, an asymmetric saddle coil pair including a first asymmetric saddle coil and a second asymmetric saddle coil, and a second loop coil configured in an overlapping arrangement in a left-right direction, wherein the first and second loop coils of at least one of the RF coil sections are shifted in the superior-inferior direction.

22. An RF coil array according to claim 21, wherein the plurality of RF coil sections are configured in an overlapping arrangement.

23. An RF coil array according to claim 22, wherein a position of a center of the first loop coil is shifted in the superior-inferior direction to align with an overlap region between adjacent RF coil sections.

24. An RF coil array according to claim 22, wherein a position of a center of the second loop coil is shifted in the superior-inferior direction to align with an overlap region between adjacent RF coil sections.

25. An RF coil array according to claim 21, wherein the first asymmetric saddle coil and the second asymmetric saddle coil are overlapping.

* * * * *